United States Patent [19]
El Gamal et al.

[11] Patent Number: 5,367,208
[45] Date of Patent: *Nov. 22, 1994

[54] RECONFIGURABLE PROGRAMMABLE INTERCONNECT ARCHITECTURE

[75] Inventors: Abbas El Gamal, Palo Alto; Steve S. S. Chiang, Saratoga, both of Calif.

[73] Assignee: Actel Corporation, Sunnyvlae, Calif.

[*] Notice: The portion of the term of this patent subsequent to Jul. 19, 2005 has been disclaimed.

[21] Appl. No.: 2,873

[22] Filed: Jan. 13, 1993

Related U.S. Application Data

[60] Continuation of Ser. No. 869,488, Apr. 15, 1992, Pat. No. 5,187,393, which is a continuation of Ser. No. 621,452, Jan. 15, 1991, Pat. No. 5,172,014, which is a division of Ser. No. 309,306, Feb. 10, 1989, Pat. No. 5,015,885, which is a continuation-in-part of Ser. No. 195,728, May 18, 1988, Pat. No. 4,873,459, which is a continuation-in-part of Ser. No. 909,261, Sep. 19, 1986, Pat. No. 4,758,745.

[51] Int. Cl.$^5$ .................................. H03K 19/177
[52] U.S. Cl. .................................. 326/44; 326/39
[58] Field of Search ........................ 307/465–469, 307/465.1; 340/825.83–825.91

[56] References Cited

U.S. PATENT DOCUMENTS

| | | |
|---|---|---|
| Re. 34,363 | 8/1993 | Freeman .......................... 307/465 |
| 3,106,698 | 10/1963 | Unger . |
| 3,287,702 | 11/1962 | Borck, Jr. et al. . |
| 3,287,703 | 11/1962 | Slotnick . |
| 3,473,160 | 10/1969 | Wahlstrom . |
| 3,634,927 | 1/1972 | Neale et al. . |
| 3,816,725 | 6/1974 | Greer . |
| 3,818,452 | 6/1974 | Greer . |
| 3,849,638 | 11/1974 | Greer . |
| 3,987,287 | 10/1974 | Cox . |
| 4,240,094 | 12/1980 | Mader et al. . |
| 4,293,783 | 10/1981 | Patil . |
| 4,307,379 | 12/1981 | Wyland . |
| 4,409,499 | 10/1983 | Zapisek et al. . |
| 4,414,547 | 11/1983 | Knapp et al. . |
| 4,442,507 | 4/1984 | Roesner . |
| 4,458,297 | 7/1984 | Stopper et al. . |
| 4,499,557 | 2/1985 | Holmberg et al. . |
| 4,513,307 | 4/1985 | Brown . |
| 4,541,067 | 9/1985 | Whitaker . |
| 4,545,111 | 10/1985 | Johnson . |
| 4,569,120 | 2/1986 | Stacy et al. . |
| 4,569,121 | 2/1986 | Lim et al. . |
| 4,590,589 | 5/1986 | Gerzberg . |
| 4,597,162 | 7/1986 | Johnson et al. . |
| 4,599,705 | 7/1986 | Holmberg et al. . |
| 4,609,830 | 9/1986 | Brandman .................. 307/202.1 |
| 4,646,266 | 2/1987 | Ovshinsky et al. . |
| 4,670,749 | 6/1987 | Freeman .................. 307/465 X |
| 4,758,745 | 7/1988 | El Gamal et al. .......... 307/468 X |
| 4,780,846 | 10/1988 | Tanabe et al. ............. 307/465 X |

OTHER PUBLICATIONS

An Associative Logic Matrix; Journal of Solid State Circuits; vol. SC-11, No. 5, Oct. 1976 pp. 679–691; by D. L. Greer.

On The Use of Nonvolatile Programmable Links for Restructurable VLSI; Jan. 1979 Caltech Conference on VLSI-pp. 95–104 by J. I. Raffel.

A Programmable Logic Approach for VLSI; IEEE Transactions on Computers; vol. c-28, No. 9 Sep. 1979 pp. 594–601 by S. Patil & T. Welch.

(List continued on next page.)

*Primary Examiner*—David R. Hudspeth
*Attorney, Agent, or Firm*—Lyon & Lyon

[57] ABSTRACT

A user-programmable interconnect architecture, which may be used for logic arrays for digital and analog system design, is disclosed. In one embodiment, a plurality of logic cells or modules in a matrix are connected by vertical and horizontal wiring channels. The wiring channels may in turn be programmed by the user to interconnect the various logic cells to implement the required logic function. The wiring channels comprise wiring segments connected by normally open programmable. Elements situated at the intersection of any two segments to be connected.

43 Claims, 10 Drawing Sheets

OTHER PUBLICATIONS

A High Density Programmable Logic Array Chip; IEEE Transactions on Computers, vol. C-28, No. 9, Sep. 1979 pp. 602-608 by R. Wood.

An Electrically Alterable PLA for Fast Turnaround-Time VLSI Development Hardware; IEEE Journal of Solid State Circuits vol. SC=-15 No. 5, Oct. 1981, pp. 570-577.

A VLSI Architecture for Sound Synthesis; Department of Computer Science, California Institute of Technology, 5158:TR84, Oct. 10, 1984 by J. Wawrzynek and C. Mead.

Restructurable VLSI Program of MIT Lincoln Laboratories; Semi-annual Technical Summary Report to the Defense Advanced Research Projects Agency by A. H. Anderson, Jan. 20, 1981.

Restructurable VLSI Program of MIT Lincoln Laboratories; Semi-annual Technical Summary Report to the Defense Advanced Research Projects Agency by P. Blankenship, Oct. 14, 1991.

Restructurable VLSI Program of MIT Lincoln Laboratories; Semi-annual Technical Summary Report to the Defense Advanced Research Projects Agency Jan. 14, 1982 by P. Blankenship.

Restructurable VLSI Program of MIT Lincoln Laboratories; Semi-annual Technical Summary Report to the Defense Advanced Research Projects Agency Aug. 16, 1982 by P. Blankenship.

Restructurable VLSI Program of MIT Lincoln Laboratories; Semi-annual Report to the Defense Advanced Research Projects Agnecy Jan. 12, 1983 by P. Blankenship.

Laser Programmed Vias for Restructurable VLSI; International Electron Devices Meeting 1980 pp. 132-135 by J. I. Raffel; M. L. Naiman, R. L. Burke, G. H. Chapman and P. G. Gottschalk.

A Demonstration of very large area integration using Restructurable Laser Links; IEEE ISSCC 1982 by J. I. Raffel, G. H. Chapman, K. H. Konkle and A. M. Soares.

Restructurable VLSI, Redundancy Workshop, IEEE Solid-State Circuits and Technology Committee May 5, 1982 by A. H. Anderson.

Restructurable VLSI Using Laser Cutting and Linking; SPIE/LA '83 Jan. 17-21, 1983 by J. I. Raffel.

Laser Formed Connections Using Polyimide; Applied Physics Letter, vol. 42, No. 8 (Apr. 15, 1983) pp. 705-706 by J. I. Raffel, J. F. Freidin & G. H. Chapman.

A Demonstration of Very Large Area Integration Using Laser Restructuring IEEE 1983 International Symposium on Circuits and Systems Proceedings May 1983 by J. I. Raffel, A. H. Anderson, G. H. Chapman, S. L. Garverick, K. H. Konkle, B. Mathur and A. M. Soares.

A Single Wafer 16-Point 16-MHZ FFT Processor; IEEE Proceedings of the Custom Integrated Circuits Conference, May 1983 by S. L. Garverick & E. A. Pierce.

A demonstration of very large area integration using laser restructuring; International Symposium on Circuits and Systems, May 2-4, 1983 pp. 781-784 by J. I. Raffel, A. H. Anderson G. C. Chapman, S. L. Garverick, K. H. Konkle, B. Mathur and A. Soares.

Assignment and Linking Software for Restructurable VLSI; IEEE 1983 Custom Integrated Circuits Conference of May 23-25, 1983 by L. S. Snyder and E. A. Pierce.

Interconnection and Testing of a Wafer-Scale circuit with Laser Processing; Digest of Technical Papers of the Conference and Electro-Optics of Jun. 19-22, 1984 p. 222 by G. H. Chapman, A. H. Anderson, K. H. Konkle, B. Mathur, J. I. Raffel and A. M. Soares.

A Wafer-Scale Digital Integrator; IEEE International Conference on Computer Design-VLSI in Computers 1984, pp. 121-126; by J. I. Raffel A. H. Anderson, G. H. Chapman, K. H. Konkle B. Mathur, A. M. Soares and P. W. Wyatt.

Process Considerations in restructurable VLSI for Wafer-Scale Integral Technical Digest of the International Electron Devices Meeting 1984, pp. 626-629 by P. W. Wyatt, J. I. Raffel, G. H. Chapman, B. Mathur J. A. Burns & T. O. Herndon.

A Wafer-Scale Digital Integrator Using Restructurable VLSI; IEEE Journal of Solid-State Circuits, Fe. 1985 Vo. SC-20 pp. 399-406 by J. I. Raffel, A. H. Anderson, G. H. Chapman, K. H. Konkle, B. Mathur, A. M. Soares and P. W. Wyatt.

A specialized Silicon compiler and programmable Chip for Language Recognition, VLSI Electronics Micro- (List continued on next page.)

| LOGIC FUNCTIONS TO BE REALIZED | UNIVERSAL MODULE | | | | |
|---|---|---|---|---|---|
| | INPUT CONNECTIONS | | | OUTPUTS | |
| | S | A | B | $\overline{Q}$ | Q |
| NAND / AND | X | Y | '0' | $\overline{X \cdot Y}$ | $X \cdot Y$ |
| NOR / OR | X | '1' | Y | $\overline{X+Y}$ | $X+Y$ |
| XNOR / XOR | X | $\overline{Y}$ | Y | $X \cdot Y + \overline{X} \cdot \overline{Y}$ | $X \cdot \overline{Y} + \overline{X} \cdot Y$ |
| SR / LATCH | $\overline{Q}$ | S | $\overline{R}$ | $\overline{Q}$ | Q |
| D / LATCH | L | D | Q | $\overline{Q}$ | Q |

FIG. 2C

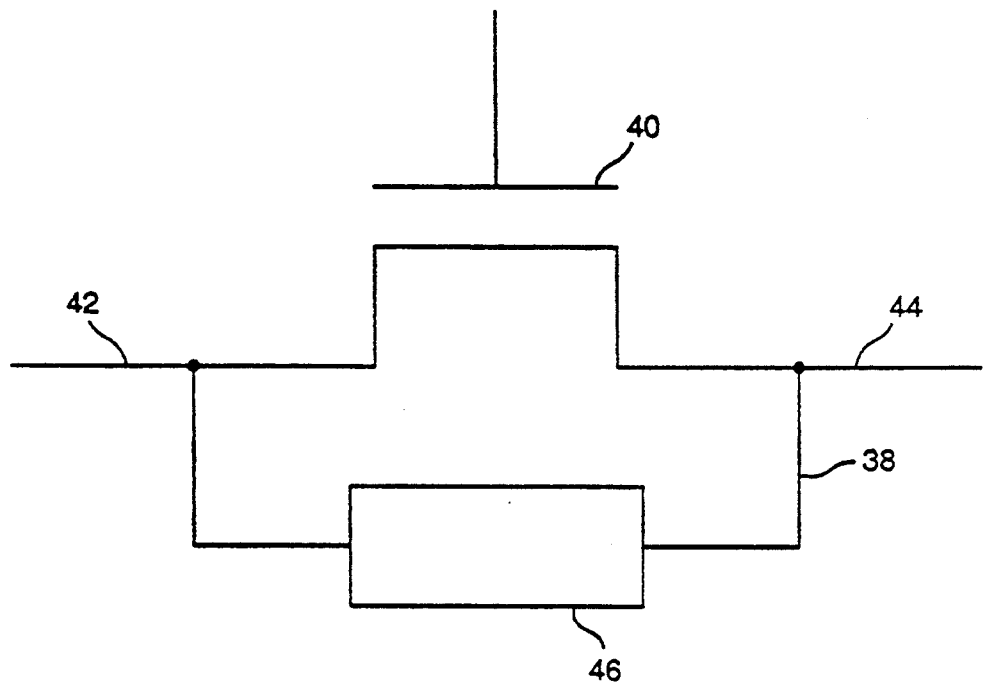

FIG. 3

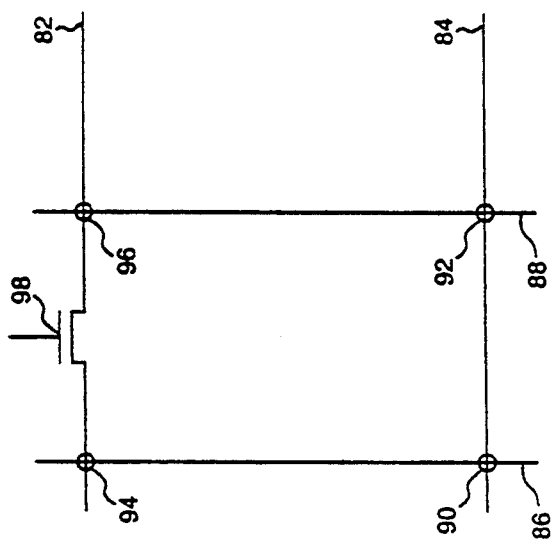
*FIG. 7E*
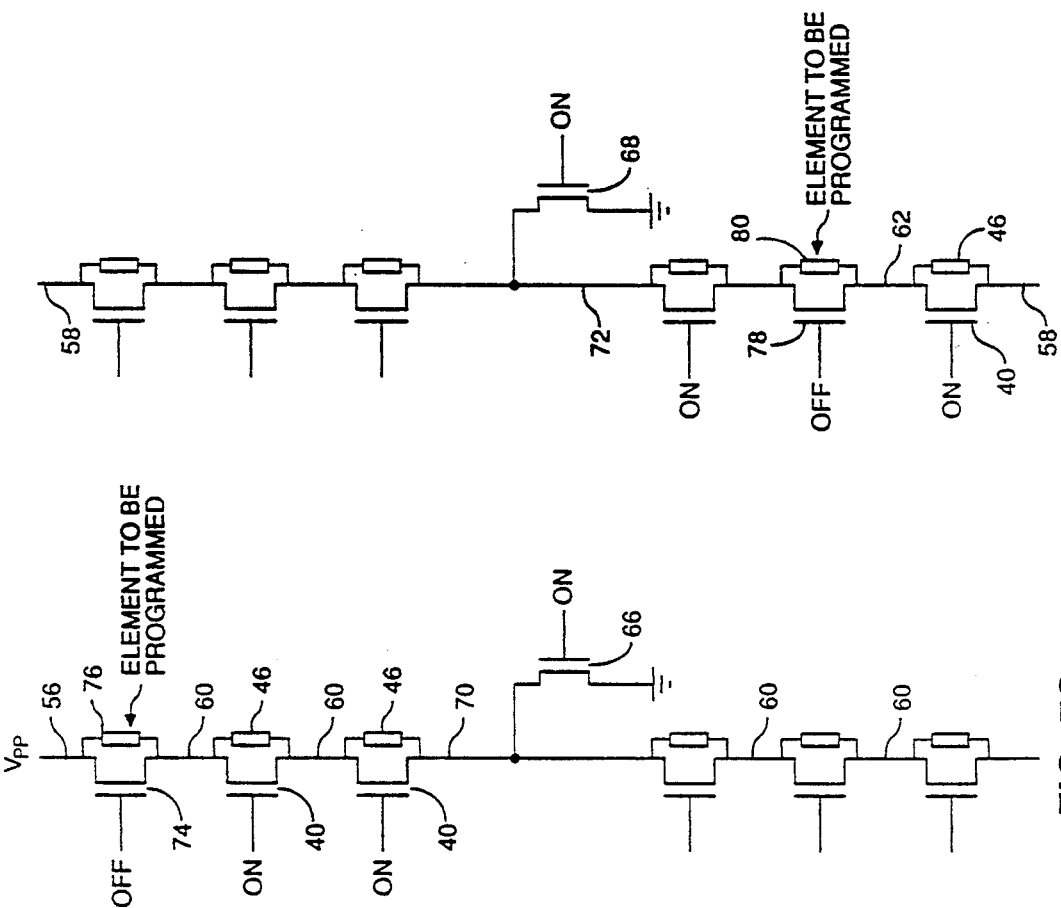
*FIG. 7D*
*FIG. 7C*

RECONFIGURABLE PROGRAMMABLE INTERCONNECT ARCHITECTURE

RELATED APPLICATIONS

This application is a continuation of co-pending application Ser. No. 07/869,488, filed Apr. 15, 1992, which is a continuation of co-pending application serial No. Ser. No. 07/621,452, filed filed Jan. 15, 1991, now U.S. Pat. No. 5,172,014, which is a division of application Ser. No. 07/309,306, filed Feb. 10, 1989, now U.S. Pat. No. 5,015,885, which is a continuation-in-part of application Ser. No. 07/195,728, filed May 18, 1988, now U.S. Pat. No. 4,873,459, which is a continuation-in-part of application Ser. No. 06/909,261, filed Sep. 19, 1986, now U.S. Pat. No. 4,758,745.

BACKGROUND OF THE INVENTION

1. Field of the Invention

The present invention relates to integrated circuit technology. More specifically, the present invention pertains to user-configurable interconnections for array logic and other circuitry.

2. The Prior Art

An integrated circuit uses a network of metal interconnects between the individual semiconductor components which are patterned with standard photolithographic processes during wafer fabrication. Multiple levels of metalized patterns may be used to increase the flexibility of the interconnects. For example in very Large Scale Integration higher density and more complex wiring networks are needed.

It has long been recognized that a user programmable interconnect technique or manufacturer programmability just prior to shipment would allow lower tooling costs and faster delivery time. One technique to accomplish this uses lasers to make or break pre-patterned metal interconnects between an array of logic cells. This is usually performed on the finished wafer prior to assembly or actually in an open package. Another approach uses an array of uncommitted interconnect metal lines using antifuses consisting of an amorphous silicon alloy sandwiched into insulation holes between third and fourth metal layers to provide electrically programmable links.

A gate array circuit is an array of uncommitted gates with uncommitted wiring channels. To implement a particular circuit function, the circuit is mapped into the array and the wiring channels and appropriate connections are mask programmed by the integrated circuit gate array vendor to implement the necessary wiring connections that form the circuit function. The gate array vendor then fabricates the circuit according to the constructed masks. Gate arrays are therefore mask programmable and not user programmable.

User-programmable logic arrays are widely used in digital system design in implementing many logic functions and replacing transistor-transistor logic (TTL) parts. Logic arrays currently available include PLA (Programmable Logic Arrays), FPLAs (Field Programmable Logic Arrays), EPLDs (Erasable Programmable Logic Devices) and logic cell arrays using RAM (Random Access Memory) cells to define logic cell function and interconnect configuration. Programmable logic circuit arrays have been usually implemented in bipolar technology using fusible links which, when programmed, define the logic function to be implemented. An example of such a link is the polysilicon fuse which is programmed" when it is blown and prevents current flow in a circuit. Such fusible links often require large current to operate and require extra area on the integrated circuit. More recently, electrically programmable read-only memory (EPROM) and electrically erasable read-only memory (EEROM) technology has been used to construct programmable logic circuit arrays. In the latter case, EPROM or EEROM cells are programmed and the stored values used to define circuit configuration.

Existing programmable array logic circuits use an AND plane of gates followed by an OR plane of gates to implement a particular logic function. The AND plane is usually user programmable while the OR plans programming is usually fixed. Variations to this architecture include registered outputs of the OR plane, partitioning of the array into smaller AND - OR arrays or macrocells and programmable input/output (I/O) architecture to implement several options of I/O requirements. The RAM implemented logic cell array consists of a matrix of configurable blocks which are programmed to implement a particular logic function by loading an internal RAM with the appropriate data pattern. The array has a network of user-programmable MOS transistors acting as electrical switches as well as vertical and horizontal lines or wires to connect the logic blocks together and to the I/O blocks.

Existing user-programmable array logic circuits described above are useful in implementing certain logic functions but have several disadvantages. First, the use of an AND plane/OR plane combination of gates to implement logic functions is inflexible and is not well suited to the requirements of random logic functions. Second, the utilization factor of such an array is quite low and a large number of gates are wasted. Third, the integrated circuit chip area-per-functional capability is usually quite high.

Gate arrays, on the other hand, are more flexible than programmable array logic and much more efficient in their gate utilization and integrated circuit chip area utilization. However, their main disadvantage is that they are mask programmable and not user programmable. This results in much higher costs to develop the circuit and its unique mask patterns, and a long turnaround time to order and receive integrated circuit chips.

OBJECTS OF THE INVENTION

An object of the invention is to provide a user programmable circuit with a flexible interconnect architecture that allows the implementation of field programmable semi-custom integrated circuits with high complexity and performance.

An additional object of the invention is to provide an array logic circuit which is more flexible that existing programmable logic circuits.

It is also an object of the invention to provide a user programmable array logic circuit that provides the same capabilities and versatility as mask programmed gate arrays with comparable performance characteristics. Other objects and features of the invention will become apparent to those skilled in the art in light of the following description and drawings of the preferred embodiment.

BRIEF DESCRIPTION OF THE INVENTION

In accordance with the present invention, a user programmable interconnect architecture is disclosed. Many kinds of electrical components or elements, which will here be generally referred to as "modules," may be interconnected by this architecture. One logic implementation of the user programmable interconnected architecture is hereinafter referred to as Configurable Array Logic circuit (CAL). The CAL consists of a plurality of logic cells or logic modules placed in an array or matrix. The array has a set of vertical wiring channels-and a set of horizontal wiring channels that are programmed by the user to interconnect the various logic cells to implement the required logic functions.

Connections to the wiring channels are made by a normally-open programmable element situated at the intersection of any two wires to be connected. To make a connection, the programmable element is programmed, resulting in a low impedance electric connection between the two wires. To provide more efficient utilization of the wiring channels, a plurality of these programmable elements are used to segment the vertical and horizontal channels into shorter wire lengths. These segments may be joined together to form longer wire connections by programming the programmable elements or left as is to provide independent segment wire lengths and allow the same wiring channel position to be used Several times for different circuit connections. According to the present invention, different segment lengths are employed for efficient connectability.

Programming circuitry is situated at the edge of the array. Programming and connectivity information is shifted into the programming circuit, and appropriate voltages applied to effect the desired connection patterns. The same vertical and horizontal channels that are used for wiring channels in normal operations may be used for programming the various interconnections and to provide complete testing of the array modules and wiring paths.

Those skilled in the art will recognize the general applicability of the interconnect architecture disclosed herein to other types of circuits, both analog and digital.

BRIEF DESCRIPTION OF THE DRAWINGS

FIG. 1b is an example of a more detailed block diagram of the circuitry of FIG. 1a.

FIG. 2c is a table showing the input and output connections to be used for the circuit of FIG. 2b to implement popular logic functions.

FIG. 3 is a schematic diagram of a programmable interconnect element shunted by its associated series-pass transistor.

FIGS. 7a–7e further illustrate the channel wiring and segmentation techniques by showing several programming examples of different connection requirements.

DESCRIPTION OF PREFERRED EMBODIMENT

Figure 1A:
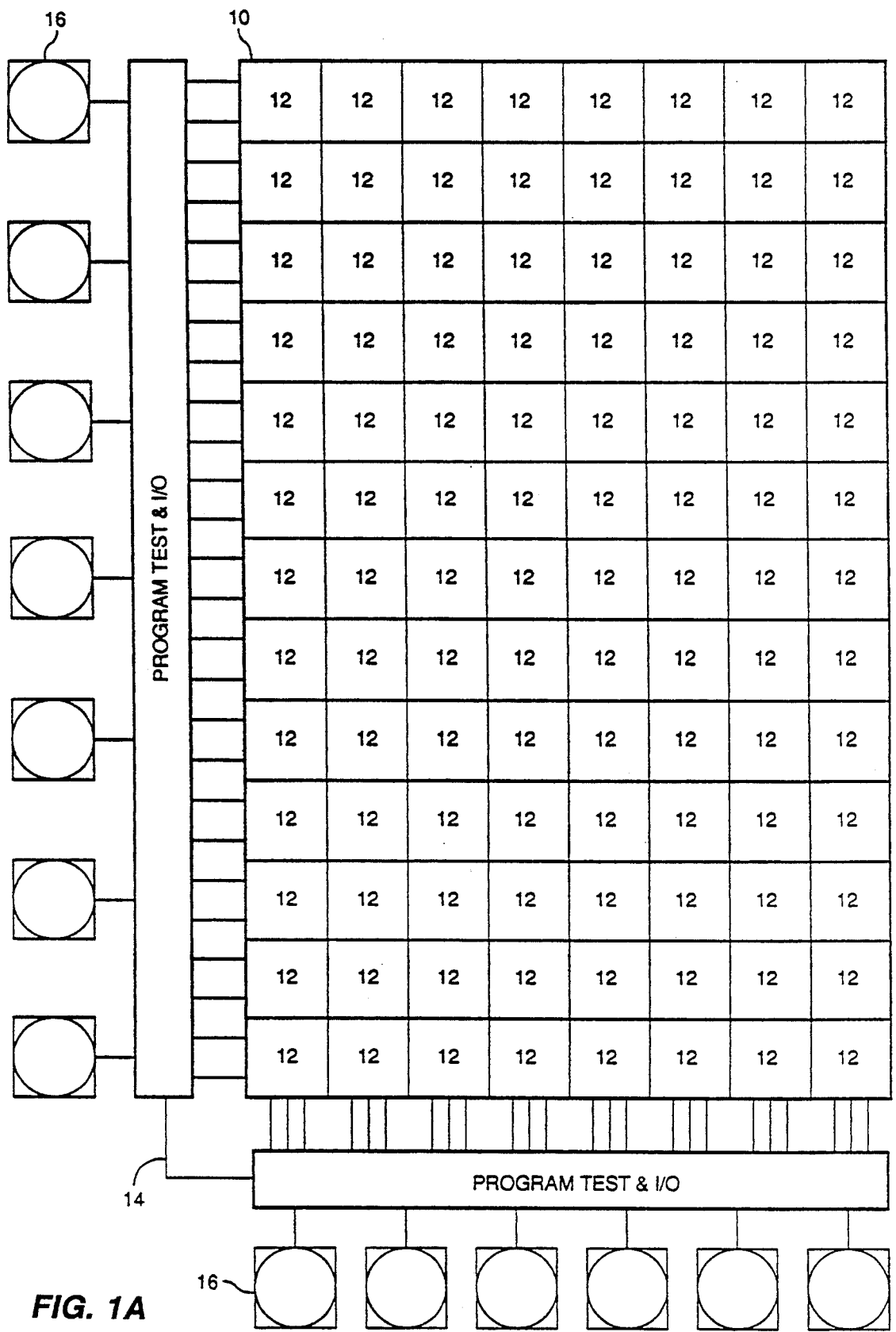
FIG. 1a is a block diagram of a preferred embodiment of a user-programmable gate array.

Referring first to FIG. 1a, a block diagram of one embodiment of the user programmable array circuit, one may see that the circuit contains an array block 10 organized into columns and rows of individual circuit modules 12; the program, test, and input/output (I/O) blocks 14 and the I/O pads 16. The number of columns or rows of modules 12 may be chosen to accommodate the desired array size. The program, test, and I/O blocks 14 are used to program all the required vertical and horizontal connections in the array, test the array logic and wiring channels, provide connections between the I/O pads and the array circuitry, and provide a mechanism to select any internal node as a test point to be observed from the I/O pads 16.

Figure 1B:
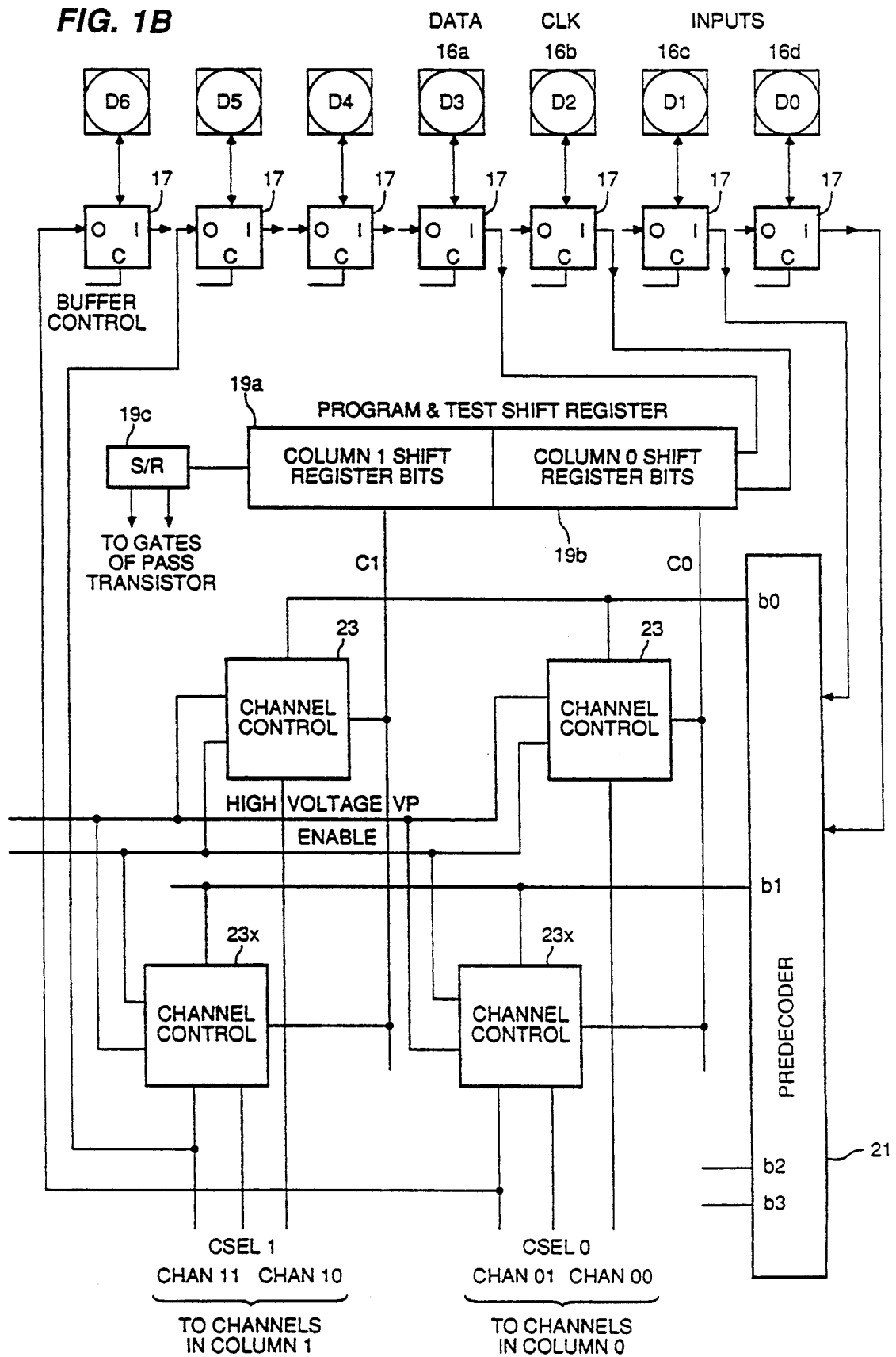

A preferred embodiment of the program, test and I/O logic 14 is shown in FIG. 1b. The figure illustrates how the circuit is used to program a plurality of channels using the example of channels situated in two different columns to explain circuit functionality. From the example illustrated in FIG. 1b, those of ordinary skill in the art will readily understand how any number of channels and columns can be programmed.

In order to select a particular channel for programming, a unique data pattern must be supplied to the circuit. The data pattern is supplied to the circuit via the I/O pads, illustrated in FIG. 1b at 16a, 16b, 16c, and 16d, respectively. The data pattern may be partitioned into two parts, a serial bit field and a parallel address selection field. Referring to FIG. 1b, the serial field is shifted into the circuit using I/O pad 16a. The clock signal needed to control the shifting of the data is supplied by I/O pad 16b. All I/O pads connect to I/O buffers 17, which may be bidirectional buffers as will be well understood by those skilled in the art.

Each input/output buffer 17 has the following connections: a connection to the pad, an input port I and an output port 0 and a buffer control input C to configure the input/output buffer as input, output or tri-state. Buffer control signals are appropriately generated from logic module outputs and internal control circuitry, which is needed during the different operating modes of the chip such as program mode, test mode, and normal mode.

Shifting of the serial input data is accomplished by shift registers 19. Shift control of the serial sequences may be performed by either on-chip or external circuitry. In the example illustrated in FIG. 1b, two stages of the shift registers 19a and 19b are shown, one shift stage per column. After loading, each shift stage contains the necessary data to control any channel within that column.

A parallel address field, also known as the predecoder (two bits wide in this example) is also supplied to the circuit by two I/O pads 16c and 16d. This field is then decoded by the 2:4 predecoder 21 having outputs $b_0$–$b_3$. Together the bits from shift registers 19a and 19b and the outputs of predecoder 21 uniquely specify the channel to be controlled for programming.

Programming control is implemented by the channel control logic units 23, which act as local decoders as well as voltage controllers for the channels. Each channel control logic unit 23, depending on the states of its inputs, is capable of driving its associated channel to $V_{pp}$ (program voltage), GND, $V_{cc}$ or a tri-state or intermediate voltage to prevent programming. Those of ordinary skill in the art will readily recognize that channel control logic units 23 may be configured using standard transistor switching circuitry.

The predecoder 21 illustrated in FIG. 1b in this implementation is a 2:4 decoder. Outputs $b_2$ and $b_3$ are shown unconnected but they would normally connect to other channel control logic units (not shown) to control more channels. The predecoder size and number of bits per shift register stage are arbitrary and are selected so that their combination is capable of uniquely selecting a channel control block, and they result in an efficient use of silicon space.

During programming, the circuit illustrated in FIG. 1b operates as follows. Input data, representing channels to be programmed, is shifted into shift registers 19a and 19b by a shift clock input appearing at I/O pad 16b. Predecode inputs are presented to I/O pads 16c and 16d, and through I/O buffers 17 to predecoder 21. Assume that the inputs on I/O 16c and 16d have caused the $b_0$ output of pre-decoder 21 to become active low. Assume further, that output $C_0$ from shift register 19b is true and that the output $C_1$ from register 19a is false, indicating that channel 00 is to be programmed and channel 10 is not to be programmed. Combination of the active low $b_0$ signal and the true $C_0$ signal on channel control unit 23b, in conjunction with the enable signal, indicating that programming is to take place, causes the programming voltage $V_{pp}$ to appear on the channel 00 line. Channel control unit 23a, however, has a false signal on line C1 coming from shift register 19a so even in the presence of the active low $b_0$ signal and the enable signal the programming voltage $V_{pp}$ is not enabled onto the channel 10 line. Instead an intermediate voltage is applied to that channel so that no programming connection is made to that channel.

From the above description, it is seen readily by those of ordinary skill in the art how an array of-virtually any size may be programmed, by using such programming circuitry at appropriately selected sections of the array.

Figure 2A:
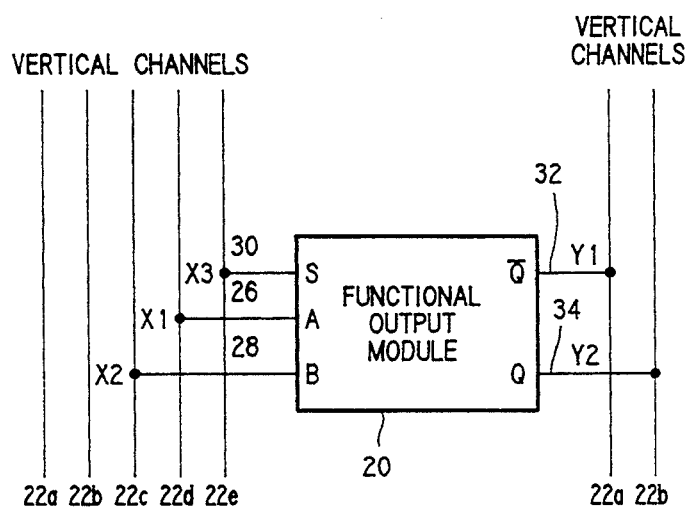
FIG. 2a is a block diagram of a preferred embodiment of a logic array module and its associated vertical and horizontal wiring channels.
Figure 2B:
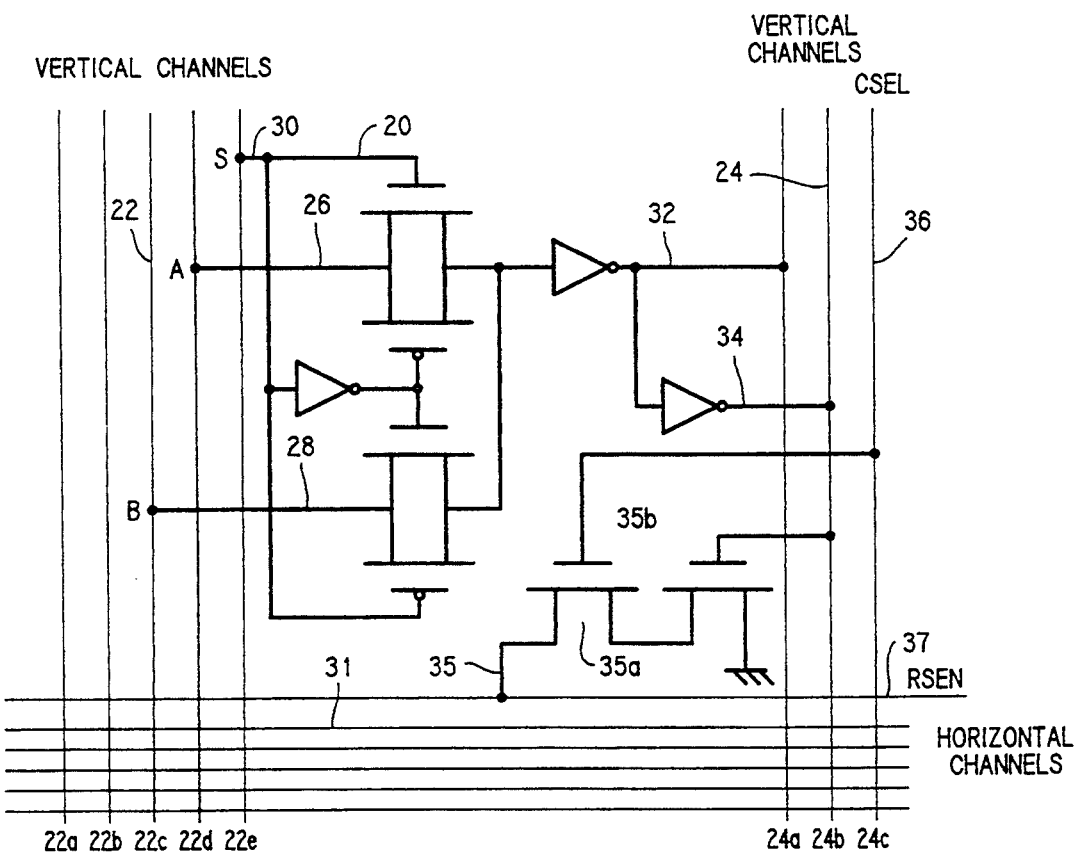
FIG. 2b is a logic diagram of the logic array module of FIG. 2a, showing connections to the horizontal and vertical wiring channels.

The individual circuit module 12 is shown in-block diagram forms in FIGS. 2a and 2b. Referring first to FIG. 2a, each individual circuit module 12 comprises a functional circuit module, designated generally as 20 and vertical wiring channels generally designated 22 and 24. (The terms "vertical" and "horizontal" are terms chosen to conveniently describe the wiring channels as they appear in the drawings; no necessary relation to the actual directions is to be implied.) The vertical wiring channels 22 are wire segments joined by programmable elements, as will be described below. Functional circuit module 20 has its A input terminal 26, its B input terminal 28, and its S input terminal 30 connected to vertical channels 22a, 22d, and 22c, respectively, and its Q1 output terminal 32 and Q output terminal 34 connected to vertical channels 24a and 24b, respectively. X1, X2, and X3, refer to the inputs of input terminals A, B, and S; Y1 and Y2 refer to the outputs of output terminals Q1 and Q.

Those of ordinary skill in the art will recognize that a programmable array architecture configured according to the present invention may have different types of array modules as well as combinations of two or more types of modules. Further, portions of the array may be replaced by large circuit blocks or megacells such as random access memory (RAM), read only memory (ROM), multiplier, and arithmetic logical units (ALU) optimized to implement certain functions. In addition, such an array may have a varying number of vertical and horizontal wiring channels.

Referring now to FIG. 2b, functional circuit module 20 will be described. In a presently preferred embodiment, functional circuit module 20 is a universal logic module having 5 terminals: 3 input terminals and 2 output terminals. Input terminals A, B, and S are shown at 26, 28 and 30 respectively. Output terminals and are shown at 32 and 34 respectively.

The cell's function is a 2:1 multiplexor and provides both the true and complement value of the function. This logic cell is quite versatile and can be used to implement a large number of logic functions. The use and versatility of such a cell is disclosed in X. Chen and S. L. Hurst, "A Comparison of Universal Logic Module Realizations and Their Application in the Synthesis of Combinatorial and Sequential Logic Networks," IEEE Transactions on Computers, Vol. C–31, no. 2.pp. 140–147, Feb., 1982, which is expressly incorporated herein by reference. FIG. 2c is a table showing the connections of the various inputs and outputs necessary to achieve popular logic functions. The five terminals of the logic cell (S, A, B, Q, Q1) are hardwired to 5 separate vertical wiring channels as shown in FIGS. 2a and 2b.

The illustrative embodiment depicted in FIG. 2b of an array module 12 according to the present invention consists of a functional circuit module 20 with inputs S, at B and outputs Q and Q, a testability circuit 35, vertical wiring channels, and horizontal wiring channels. The horizontal wiring channels 31 are wire segments joined by programmable elements, as will be described below. While the embodiments disclosed herein refer to channels as horizontal and vertical, those of ordinary skill in the art will readily recognize that any interconnect path shape or orientation may be employed as a matter of design choice.

FIG. 3 depicts a preferred embodiment of the connection 38 which connects together the segmented wiring channels of the present invention. A series-pass transistor 40 has its source 42 and drain 44 connected by a programmable element 46.

In a preferred embodiment, programmable element 46 may be an element like that described in co-pending application Ser. No. 06/861,519, filed May 9, 1986, now U.S. Pat. No. 4,823,181, assigned to the same assignee as the present invention. This document is expressly incorporated herein by reference. Simply stated, this embodiment of a programmable element may consist of two conductors separated by a dielectric.

The series-pass transistor 40 in parallel with programmable interconnect circuit element 46 is activated in order to bypass programmable element 46. When series-pass transistor 40 is not activated, a potential may be created across programmable element 46 in order to "program" that element by creating a durable low-impedance electric contact between the two conductors, as described above. It will be understood by those of ordinary skill in the art that other programmable interconnect elements, such as fusible links, could be used to configure the architecture of the present invention, although the implementation mechanism would differ according to the nature of the programmable interconnect element.

Figure 4:
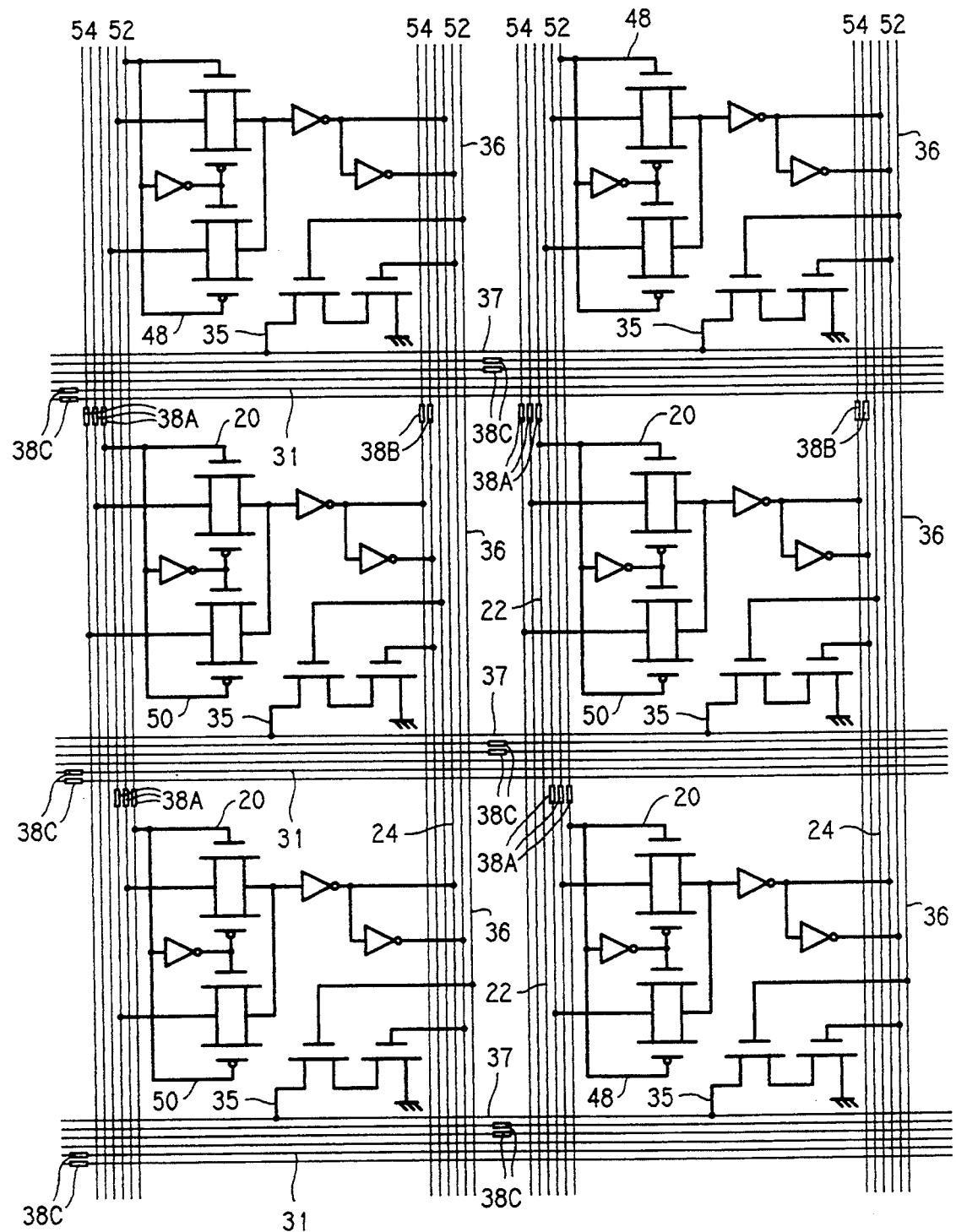
FIG. 4 shows an expanded view of a section of an array according to the present invention consisting of two columns and three rows of modules.

FIG. 4 shows an expanded view of a section of the user-programmable circuit array with logic cells or individual circuit modules 12 in two columns and three rows. Each circuit module 12 is identical to the one shown in FIG. 2b. The diagram further illustrates how vertical wiring channels 22 and 24 and horizontal wiring channels 31 are connected to various logic cells and their allocation between adjacent cells. The vertical channels connected to the logic cell terminals are shared between the logic cells of alternate rows. This is done by segmenting the channels so that each cell has unique vertical channel segments. Cells in odd rows (cells 48) use the same vertical channel space (channels 52). Cells in even rows (cells 50) use the same vertical channel space (channels 54), but not the same vertical channel space as the odd rows (channels 52). Channel segmentation is accomplished by series-pass transistors or series-pass transistors with programmable elements connected in parallel connections 38a, 38b, and 38c generally described above under reference numeral 38. A similar channel segmentation technique is used for the horizontal wiring channels. In FIG. 4, connections 38a join vertical channel segments on the input side of the logic modules, connections 38b join vertical channel segments on the output side of the logic modules, and connections 38c join horizontal channel segments. The segmentation techniques are illustrated in more detail in FIGS. 5 and 6.

Figure 5:
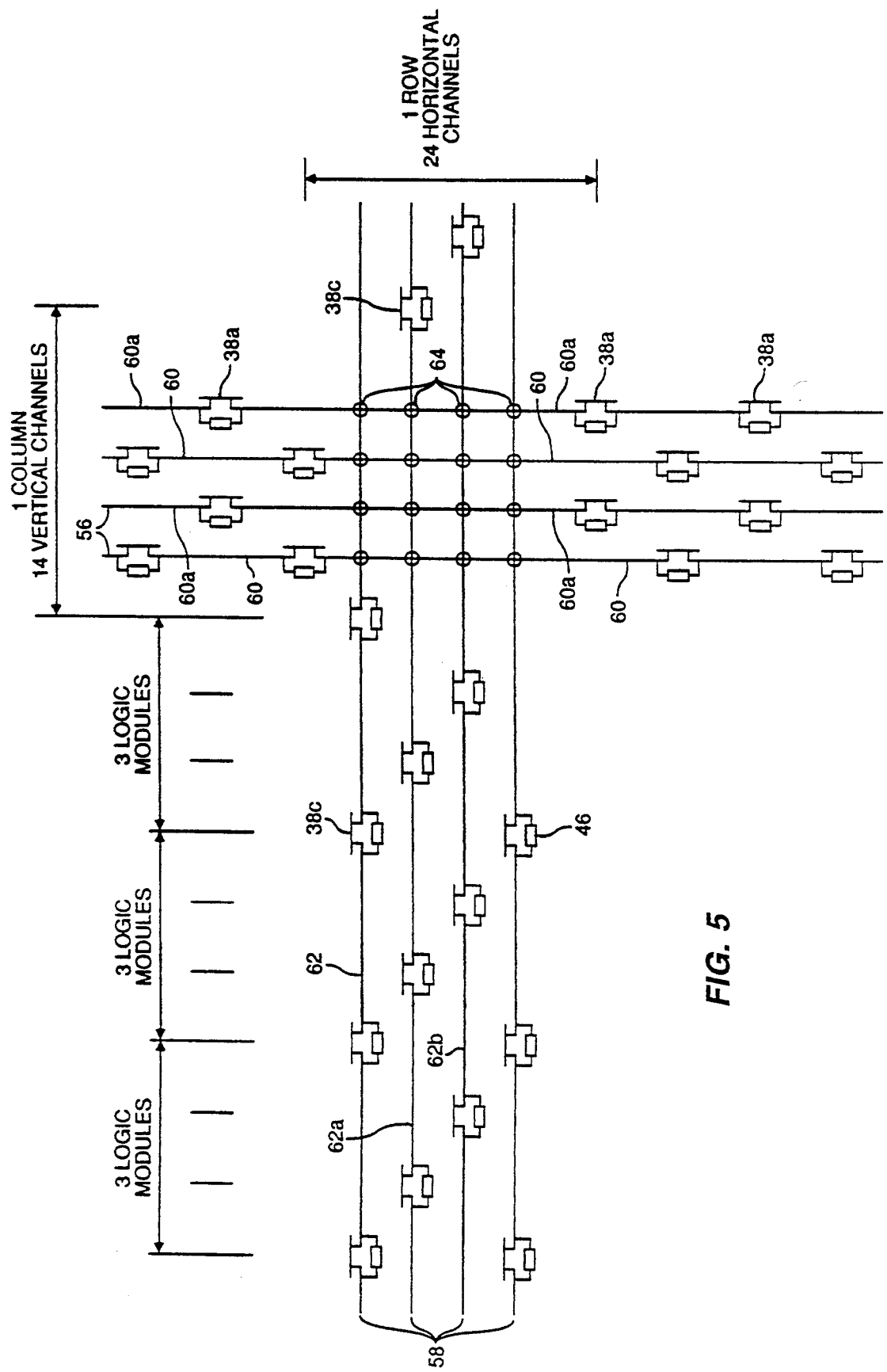
FIG. 5 is a schematic diagram of a portion of the vertical and horizontal channel wiring used in the CAL array.

FIG. 5 illustrates the vertical and horizontal wiring segmentation. As mentioned earlier, wiring channels are segmented and offset for a more efficient utilization of the available wiring space and reduction of overhead circuits for the selection and programming functions (the circuits that activate series-pass transistors 40 in the connections 38). The example in FIG. 5 uses fourteen vertical channels per column of modules and twenty four horizontal channels per row of modules for a twenty-three column, fourteen row matrix of logic modules. The vertical channels and horizontal channels shown are merely illustrative; only vertical channels, horizontal channels, and control lines are shown in FIG. 6.

Figure 6:
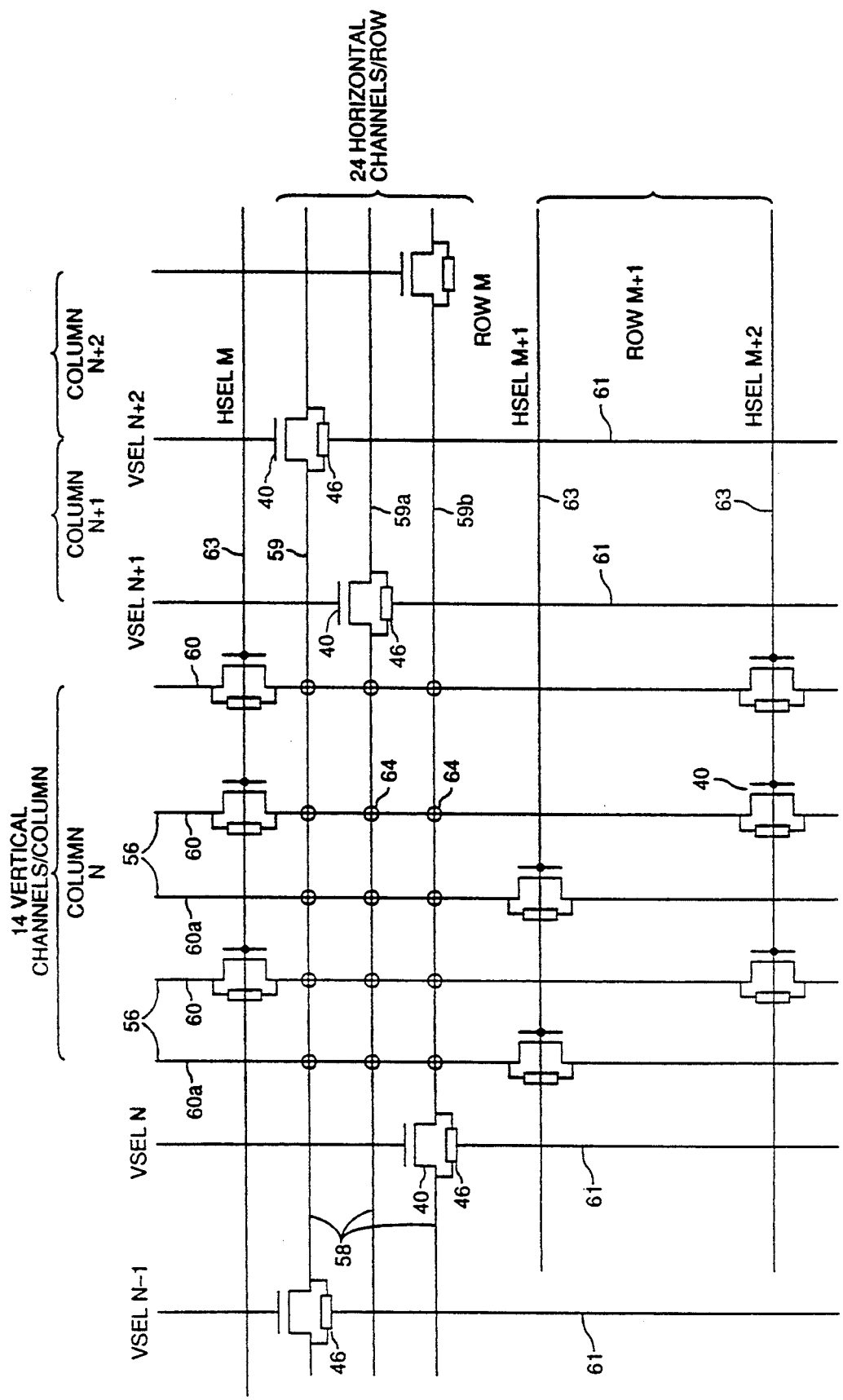
FIG. 6 is a further expansion of the horizontal and vertical channel wiring scheme to illustrate the segmentation mechanism.

Vertical channels generally referred to in FIGS. 5 and 6 as 56 are segmented into a series of segments 60 or 60a with each segment extending over the length of two rows and each segment separated from adjacent segments by series-pass transistors 40 with a programmable element 46 connected in parallel.

Each vertical channel 56 is also offset by one module length from its adjacent channel. For example, as shown in FIG. 6, if a vertical channel segment 60 starts at module row M, then the adjacent channel segment 60a would start at module row M+1 and the following segment would start at module row M. The vertical offset technique is referred to as to a 2-way staggered wiring scheme. This segment offset technique provides a significant reduction in the number of channels required for routing.

The series-pass transistors 40 that connect vertical wiring segments 60, 60a or horizontal wiring segments 59, 59a, 59b are controlled by vertical select lines (VSEL) 61 and horizontal select lints (HSEL) 63, respectively. The VSEL and HSEL control lines can bias the series-pass transistors to which they are connected in order to cause such transistors to conduct. The control lines do not need to be continuous throughout the array as indicated in FIG. 6. The series-pass transistors 40 are used as feed-through selection transistors during programming of the programmable elements 46 as illustrated in FIG. 6. The vertical segment length must be at least one module length. A length of two module lengths is preferred but may be varied to implement different wiring alternatives. Use of only long segment lengths is inefficient in the use of wiring space while use of only short segment lengths degrades performance and is less efficient in silicon area utilization.

A similar segmentation and offset technique is applied to horizontal wiring channels 58. In the example shown in FIG. 5, the horizontal segment length is three modules, i.e., each horizontal segment 62, 62a or 62b spans three columns of modules. The horizontal wiring scheme also uses a segment offset technique with an offset value in a preferred embodiment of three module lengths. As shown in FIG. 5, those of ordinary skill in the art will recognize that, due to the offset, certain ones of the segments at the edges of the array will have a span of one and two module lengths instead of three.

Figure 7A:
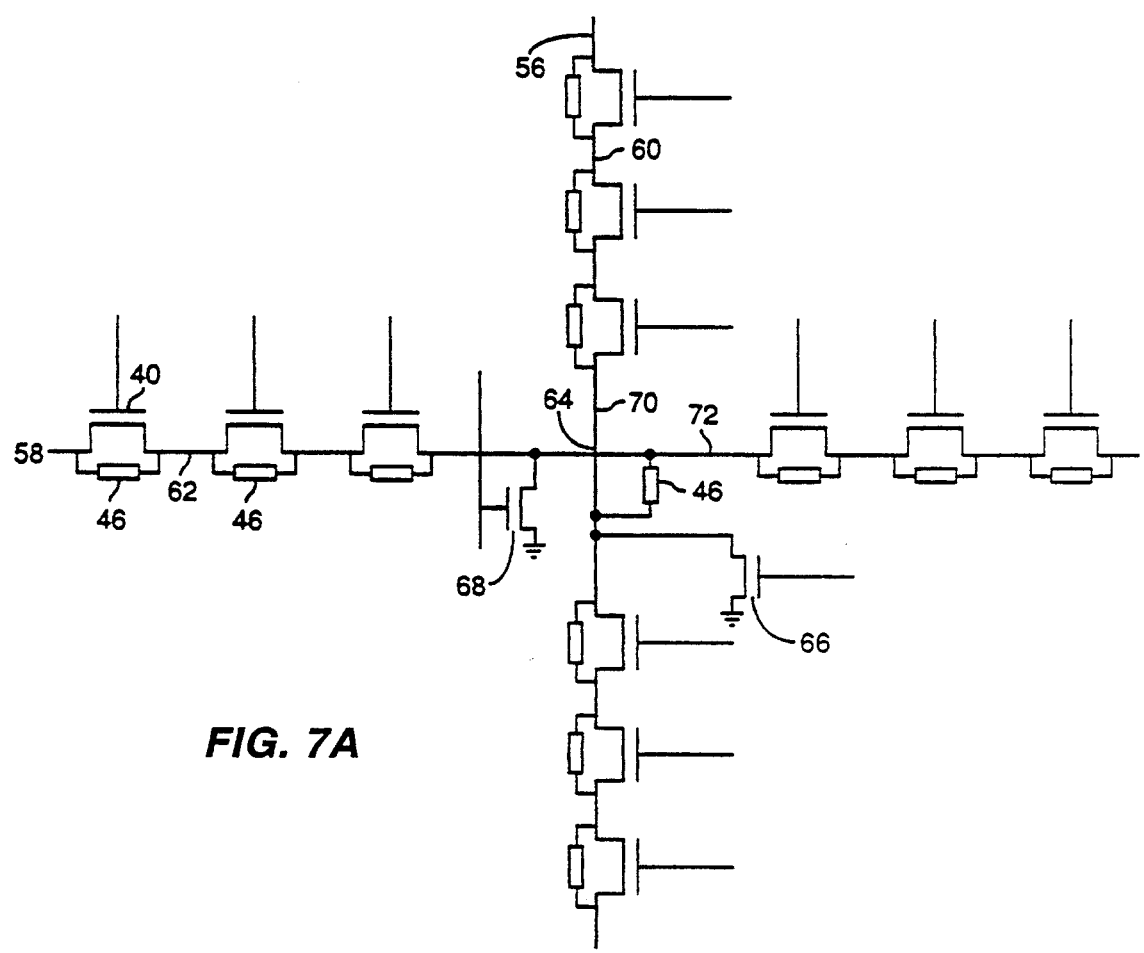

At the intersection 64 of each vertical and horizontal channel, a normally open or unfused programmable element 46 is placed, as may best be seen in FIG. 7a. When the programmable element 46 is programmed, an electrical connection is made between the channels at the intersection 64. In this architecture, any vertical channel may thus be connected to any horizontal channel by means of a programmable element.

FIGS. 7a to 7d illustrate the programming techniques used to connect various channel segment configurations including vertical to horizontal connection, vertical segment to vertical segment and horizontal segment to horizontal segment connection in an embodiment where antifuse elements are used as programmable interconnect elements. FIG. 7a shows one vertical channel 56 and one horizontal channel 58 intersecting as shown. The relative locations of the vertical and horizontal channels in the array are not important and the same programming technique is used regardless of the position in the array of the programmable interconnect element.

Two additional transistors are shown in FIG. 7a: a vertical select transistor 66 and a horizontal select transistor 68. The vertical select transistor 66 pulls the middle vertical segment 70 of a vertical channel 56 to ground while the horizontal select transistor 68 is used to pull middle horizontal segment 72 of a horizontal channel 58 to ground. Vertical or horizontal select transistors 66 or 68 may also be used to charge the middle segment to the appropriate voltage needed for programming. Vertical and horizontal select transistors 66 and 68 are useful to lower the series resistance of a wiring channel during programming by reducing the number of transistors between the programming voltage and ground, as is best seen in FIGS. 7c and 7d. They need not be connected to middle wiring segments but middle wiring segments are preferred.

Figure 7B:
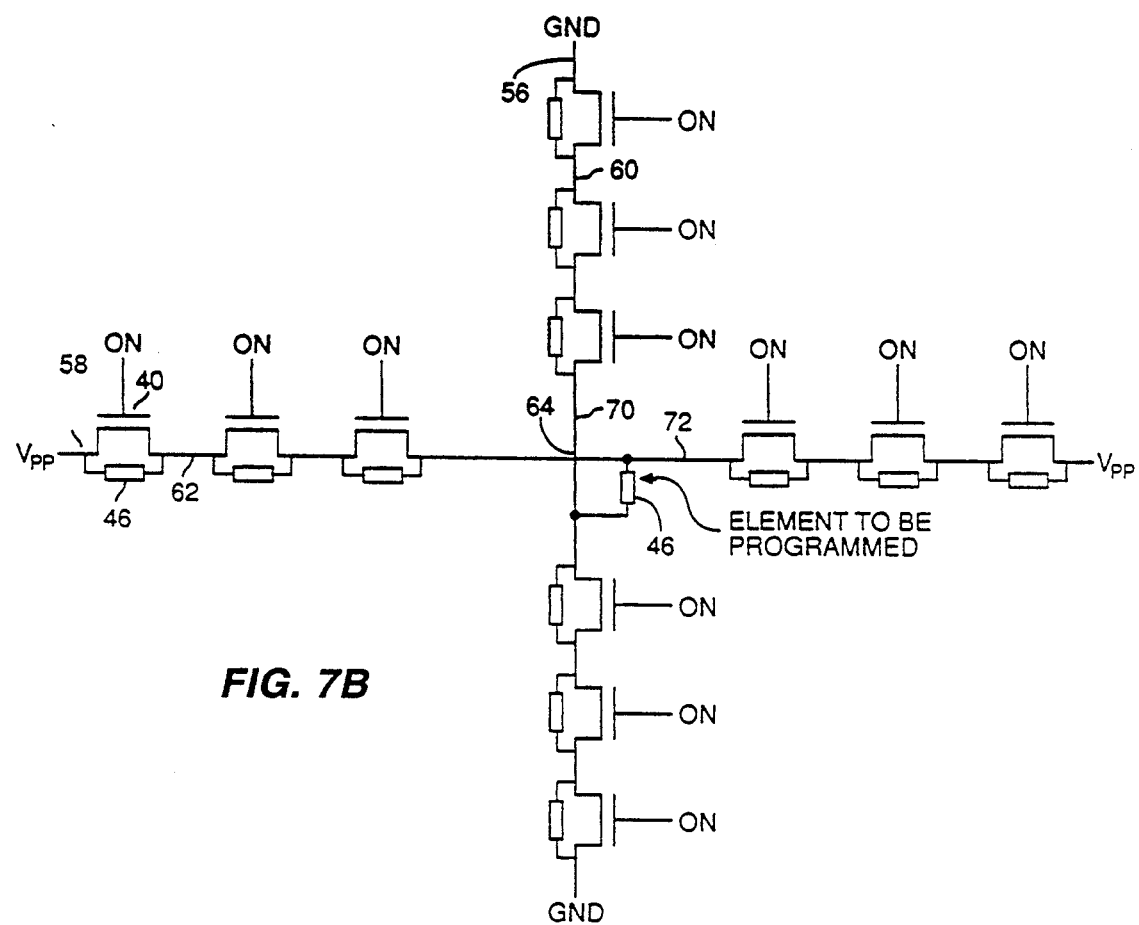

FIG. 7b illustrates how the vertical and horizontal channels may be programmed to make a connection between them. The programming voltage $V_{pp}$ is applied to both ends of the horizontal channel 58 while ground potential GND is applied to both ends of the vertical channel 56. All series-pass transistors 40 are turned ON, i.e., biased to conduct. The programmable element 46 at intersection 64 would then be programmed and a connection made between the two intersecting segments shown in FIG. 7b. The voltages $V_{pp}$ and GND are applied to both sides of the horizontal and vertical channel to provide lower resistance in the programming path and hence more efficient programming and lower final resistance of the programming element 46 at intersection 64. All other horizontal and vertical segments not selected to program the programmable elements in FIG. 7b are biased to an intermediate voltage V such that the voltage difference between V and GND, and V and $V_{pp}$ is insufficient to program a programmable element. This same technique is used in all the programming examples shown in FIGS. 7b–7d.

FIG. 7c illustrates how a vertical segment would be programmed to connect to its adjacent segment. The programming voltage $V_{pp}$ is applied to the programmable element 76 to be programmed while the middle segment 70 is pulled to ground by the vertical select transistor 66. All series-pass transistors between $V_{pp}$ node and the middle segment are turned ON except for the particular transistor 74 whose terminals are to be connected by the programmable element 76. This forces the programming voltage across the programmable element 76 and programs it.

FIG. 7d shows a similar scheme used for horizontal segment connections to adjacent horizontal segments. In this case, the horizontal select transistor 68 is turned on, pulling the middle horizontal segment to ground while $V_{pp}$ is applied to one end of the horizontal channel. All series transistors are ON except the series transistor 78 whose terminals are to be connected by programming programmable element 80.

Those of ordinary skill in the art will recognize that the programming process in this embodiment is not reversible, and that, depending on how a particular array according to the present invention is implemented, thought should be given to the order in which the particular desired elements are programmed.

By way of illustration, attention is drawn to FIG. 7e, which shows wiring channels 82, 84, 86, and 88 having fuses 90, 92, 94, and 96 at their intersections. Pass transistor 98 is also shown. Assume that it is desired to program fuses 90, 92, and 94 but not 96.

Those of ordinary skill in the art will readily see that if fuses 90 and 92 are programmed before fuse 98, it cannot be guaranteed that fuse 94 can be programmed. This is because series pass transistor 98 must be turned on to allow fuse 94 to be programmed. If, however, fuses 90 and 94 are programmed prior to fuse 92, all three fuses may be programmed successfully, leaving fuse 96 unprogrammed, as desired.

Thus, preferred embodiments of the invention have been illustrated and described with reference to the accompanying drawings. Those of skill in the art will understand that these preferred embodiments are given by way of example only. Various changes and modifications may be made without departing from the scope and spirit of the invention, which is intended to be defined by the appended claims.

What is claimed is:

1. In an integrated circuit, an electrically programmable interconnect architecture, comprising:
   a plurality of function circuit modules placed in an array, said modules having connection nodes;
   a plurality of sets of wiring channels, each of said plurality of sets of wiring channels comprising at least one wiring channel, at least one of said wiring channels comprising at least two wiring segments and wherein at least one of said wiring segments is electrically connectable to at least one of said connection nodes;
   a plurality of two-terminal, normally-open, electrically-programmable elements, said elements located between selected pairs of said wiring segments comprising one of said wiring channels, said programmable elements being characterized by a high impedance before programming and being selectively programmable by the user in order to create a permanent bidirectional low impedance electrical connection between said selected pairs of said wiring segments;
   means for supplying a first programming potential to a first one of said wiring segments of said selected pair of wiring segments; and
   means for supplying a second programming potential to a second one of said wiring segments of said selected pair of wiring segments, the difference between said first and second programming potentials being sufficient to program said electrically-programmable elements.

2. The electrically programmable interconnect architecture of claim 1 comprising a first layer and a second layer, said first and second layer being electrically isolated from each other, wherein at least one of said wiring channels is disposed in said first layer and at least one of said wiring channels is disposed in said second layer, said at least one wiring channel disposed in said first layer is oriented to cross said at least one of said wiring channels disposed in said second layer forming an intersection where said two wiring channels cross.

3. The electrically-programmable interconnect architecture of claim 2, wherein said programmable elements join selected ones of said wiring segments of said wiring channels disposed in said first layer, with selected ones of said wiring channels disposed in said second layer at said intersections.

4. The electrically-programmable interconnect architecture according to claim 1 further comprising:
   series-pass transistors, having control elements, connecting selected ones of said wiring segments; and
   selection circuitry connected to said control elements of each of said series-pass transistors for selectively biasing each one of said series-pass transistors to cause it to conduct or not to conduct.

5. The electrically-programmable interconnect architecture according to claim 2 further comprising:
   series-pass transistors, having control elements, connecting selected ones of said wiring segments; and
   selection circuitry connected to said control elements of each of said series-pass transistors for selectively biasing each one of said series-pass transistors to cause it to conduct or not to conduct.

6. The electrically-programmable interconnect architecture according to claim 3 further comprising:
   series-pass transistors, having control elements, connecting selected ones of said wiring segments; and
   selection circuitry connected to said control elements of each of said series-pass transistors for selectively biasing each one of said series-pass transistors to cause it to conduct or not to conduct.

7. A user-programmable function circuit array comprising a plurality of function circuit modules placed on a substrate, each said function circuit module having connection nodes;
   a plurality of first wiring channels disposed in a first layer and having a first orientation, said first wiring channels comprising a plurality of first wire segments, at least one of said wire segments is electrically connectable to at least one of said connection nodes;

a plurality of second wiring channels disposed in a second layer electrically isolated from said first layer and having a second orientation, said second wiring channels comprising a plurality of second wire segments, said second orientation being such that ones of said second wire segments cross ones of said first wire segments at intersections;

a two-terminal, electrically-programmable, normally open interconnect element joining at least one of said first wire segments to at least one of said second wire segments at one of said intersections, said interconnect element being selectively programmable by the user in order to create a permanent bidirectional low-impedance electrical connection between said first and second wire segments which said interconnect element joins;

means for selectively supplying a first programming potential to a selected one of said first wire segments connected to one of said interconnect elements to be programmed; and means for supplying a second programming potential to a selected one of said second wire segments connected to said interconnect element to be programmed, the difference between said first and second programming potentials being sufficient to program said interconnect element.

8. The function circuit array according to claim 7 in which one or more of said first wire segments is joined to one or more other adjacent first wire segments of said same first wiring channel by one of said interconnect elements.

9. The function circuit array according to claim 7 in which one or more of said second wire segments is joined to one or more other adjacent second wire segments of said same second wiring channel by one of said interconnect elements.

10. The function circuit array according to claim 7 wherein said function circuit modules comprise a height and width and wherein substantially all of said first and second wire segments have lengths at least the height or width of one of said function circuit modules.

11. The function circuit array according to claim 8 in which said first wire segments have a length substantially said height or width of two of said function circuit modules and said second wire segments have a length substantially said height or width of at least three of said function circuit modules.

12. The function circuit array according to claim 9 in which said first wire segments have a length substantially said height or width of two of said function circuit modules and said second wire segments have a length substantially said height or width of at least three of said function circuit modules.

13. The function circuit array according to claim 8 further comprising series-pass transistors electrically connected in parallel with selected ones of said interconnect elements.

14. The function circuit array according to claim 9 further comprising series-pass transistors electrically connected in parallel with selected ones of said interconnect elements.

15. The function circuit array according to claim 13 in which at least two of adjacent ones of said first or second wire segments of said respective first or second wiring channels are joined in series by said series-pass transistors having control elements.

16. The function circuit array according to claim 14 in which at least two of adjacent ones of said first or second wire segments of said respective first or second wiring channels are joined in series by said series-pass transistors having control elements.

17. The function circuit array according to claim 15 further comprising selection circuitry connected to said control element of each of said series-pass transistors, said selection circuitry selectively causes said series-pass transistor to conduct or not to conduct current between said wire segments to which said series pass transistor is electrically connected.

18. The function circuit array according to claim 16 further comprising selection circuitry connected to said control element of each of said series-pass transistors, said selection circuitry selectively causes said series-pass transistor to conduct or not to conduct current between said wire segments to which said series pass transistor is electrically connected.

19. The function circuit array according to claim 15 further comprising select transistors electrically connected to selected ones of said first or second wire segments of each of said first or second wiring channels which, when said select transistor is biased to conduct, connects said selected first or second wire segments to a selected potential.

20. The function circuit array according to claim 16 further comprising select transistors electrically connected to selected ones of said first or second wire segments of each of said first or second wiring channels which, when said select transistor is biased to conduct, connects said selected first or second wire segments to a selected potential.

21. A programmable function circuit array, comprising:

a plurality of function circuit modules placed in an array, said function circuit modules each having connection nodes;

a plurality of sets of wiring channels, at least one wiring channel of said plurality of sets of wiring channels is electrically connectable to at least one of said connection nodes;

at least one wiring channel of each of said plurality of sets of wiring channels comprising at least two wire segments, at least one of said sets of wiring channels oriented substantially non-parallel to other ones of said sets of wiring channels such that at least two of said wire segments intersect, thereby forming intersecting wire segments;

at least two of said intersecting wire segments being connected by a user electrically-programmable element;

said wire segments of at least one of said wiring channels joined in series by series-pass transistors;

programming circuitry connected to said series-pass transistors capable of selectively biasing said series-pass transistors to cause them to conduct or not to conduct;

means for supplying a first programming potential to a selected first wire segment; and means for supplying a second programming potential to a selected second wire segment intersecting said selected first wire segment, the difference between said first and second programming potentials being sufficient to program said electrically-programmable element connected therebetween.

22. An interconnect architecture for use in a user-programmable integrated circuit disposed on a semiconductor substrate, said integrated circuit including a plurality of logic function circuits placed in an array on said semiconductor substrate, said array arranged as a plurality of an equal number of rows and columns of said logic function circuits each of said rows and columns comprising n logic function circuits, where n is a number greater than 2, each of said logic function circuits including at least one input and at least one output, said interconnect architecture including a plurality of sets of wiring channels, each of said sets comprising a plurality of wiring channels and at least two of said wiring channels in said sets comprising wire segments arranged end-to-end; each of said sets associated with at least one of said rows or said columns of said array, said wire segments of different ones of said wiring channels of said same set run substantially parallel to one another and are electrically connectable to said logic function circuits, first ones of said wire segments having a length substantially equal to the distance spanning two adjacent ones of said logic function circuits, second ones of said wire segments having a length substantially equal to the distance spanning one of said logic function circuits;

said wire segments of said same wiring channel are electrically user-interconnectable to adjacent ones of said wire segments in said same wiring channel and wherein said wire segments in said same set of wiring channels are offset.

23. The interconnect architecture of claim 22, further including third ones of said wire segments having a length substantially equal to the distance spanning n adjacent ones of said logic function circuits.

24. The interconnect architecture of claim 22 or 23, further including additional ones of said wire segments having a length substantially equal to the distance spanning n/2 adjacent ones of said logic function circuits.

25. The interconnect architecture of claim 22 wherein at least one of said wire segments is connected to said at least one input and at least one of said wire segments is connected to said at least one output of said logic function circuits by user-programmable elements.

26. The interconnect architecture of claim 22 further including a plurality of input/output ports surrounding said array and means for programmably connecting selected ones of said input/output ports to at least one of said wire segments.

27. The interconnect architecture for use in a user programmable integrated circuit disposed on a semiconductor substrate, said integrated circuit including a plurality of logic function circuits and megacells placed in an array on said semiconductor substrate, said array arranged as a plurality of rows and columns of said logic function circuits and megacells, each of said logic function circuits and megacells including at least one input and at least one output, said interconnect architecture including a plurality of wire segments associated with at least one of said rows or said columns of said array, said wire segments of said wiring channels of same set of wiring channels running substantially parallel to one another; said wire segments are electrically connectable to said logic function circuits and megacells;

first ones of said wire segments having a length substantially equal to the distance spanning three adjacent ones of said logic function circuits and megacells;

second ones of said wire segments having a length substantially equal to the distance spanning one, two, three, or more adjacent ones of said logic function circuits and megacells;

said wire segments being electrically user-interconnectable to adjacent ones of said wire segments in said same wiring channel and wherein said wire segments are offset from one another.

28. A logic function circuit interconnect architecture for use in a user-programmable integrated circuit disposed on a substrate, said integrated circuit including a plurality of logic function circuits placed in an array on said substrate, said array arranged as a plurality of rows and columns of said logic function circuits, each of said logic function circuits having a discernable height and width and including at least one input and at least one output, said interconnect architecture including a plurality of wiring channels, said wiring channels comprised of user-interconnectable wire segments of minimum fixed lengths spanning rows and columns of said logic function circuits of said array, said wiring channels disbursed in sets, each set associated with at least one of three rows or three columns of said logic function circuits; said wiring channels being electrically connectable to said inputs and outputs of said logic function circuits;

at least one of said wiring channels comprises said wire segments having said minimum fixed length substantially the length or height of said array of logic function circuits and at least two of said wiring channels include said wire segments wherein said wire segments spanning a first or last row or column of said array have said minimum fixed length of substantially the height or width of either one of said logic function circuits or of two adjacent ones of said logic function circuits and the remainder of said wire segments in said at least two wiring channels have a minimum fixed length of the height or width of two adjacent ones of said logic function circuits;

said wire segments of said wiring channels being electrically user-interconnectable to an adjacent one of said wire segments in said same wiring channel and wherein said wire segments are offset.

29. The interconnect architecture of claim 28 wherein at least one of said wiring channels comprises said wire segments having said minimum fixed length of substantially half of the length of said array.

30. The interconnect architecture of claim 28 wherein said minimum fixed lengths of said wire segments include lengths of said height or width of n of said adjacent logic function circuits where n is greater than two.

31. The interconnect architecture of claim 28 wherein said logic function circuits are all the same.

32. The interconnect architecture of claim 28 wherein said logic function circuits are a combination of two or more different types of circuits.

33. The interconnect architecture of claim 28 wherein a plurality of said logic function circuits are replaced by a megacell.

34. The interconnect architecture of claim 28 wherein said logic function circuits comprise at least one RAM element.

35. The interconnect structure of claim 28 wherein each of said rows of said logic function circuits is associated with at least one of said sets of wiring channels and each of said columns of said logic function circuits is associated with at least one of said sets of wiring channels.

36. The interconnect architecture of claim 35 wherein said wiring channels associated with said columns of said logic function circuits cross said wiring channels associated with said rows of said logic function circuits at intersections and said wiring channels associated with said columns of said logic function circuits are user-interconnectable at said intersections to a plurality of said wiring channels associated with said rows of said logic function circuits.

37. A logic function circuit interconnect architecture for a user-programmable integrated circuit disposed on a substrate,
   said integrated circuit including a plurality of logic function circuits placed in an array on said substrate,
   said array arranged as a plurality of rows and columns of said logic function circuits, each of said logic function circuits having a discernable height and width and including at least one input and at least one output,
   said interconnect architecture including a plurality of sets of interconnect buses, each of said rows of said logic function circuits associated with at least one of said sets of interconnect buses and each of said columns of said logic function circuits associated with at least one other of said sets of interconnect buses;
   said sets of interconnect buses comprising wiring channels, at least one of said outputs of said logic function circuits being user-connectable through a single user-programmable element to at least one of said wiring channels of at least two of said sets of interconnect buses;
   said sets of interconnect buses associated with said columns of said logic function circuits cross said sets of interconnect buses associated with said rows of said logic function circuits at intersections;
   a plurality of said wiring channels of said sets of interconnect buses associated with said columns of said logic function circuits are user-interconnectable at said intersections to a plurality of said wiring channels of said sets of interconnect buses associated with said rows of said logic function circuits;
   said wiring channels comprise user-interconnectable segments of minimum fixed lengths spanning rows and columns of said logic function circuits of said array;
   said minimum fixed length of said segments of at least one of said wiring channels is substantially the length or height of said array of logic function circuits;
   wherein said minimum fixed length of said segments spanning a first or last row or column of said array of at least two of said wiring channels of each of said sets of interconnect buses is substantially the height or width of either one of said logic function circuits or of two adjacent ones of said logic function circuits; the minimum fixed length of said remainder of said segments in said at least two wiring channels is the height or width of two adjacent ones of said logic function circuits; and
   said wire segments of said interconnect buses are electrically user-interconnectable to an adjacent one of said wire segments in said same wiring channel and wherein said wire segments are offset.

38. The interconnect architecture of claim 37 wherein at least one of said wiring channels comprises said segments having said minimum fixed length of substantially half of the length of said array.

39. The interconnect architecture of claim 37 wherein said minimum fixed lengths of said segments include lengths of said height or width of n of said adjacent logic function circuits where n is greater than two.

40. The logic function circuit interconnect architecture of claim 37 wherein said logic function circuits are all the same.

41. The logic function circuit interconnect architecture of claim 37 wherein said logic function circuits are a combination of two or more different types of circuits.

42. The logic function circuit interconnect architecture of claim 37 wherein a plurality of said logic function circuits are replaced by a megacell.

43. The logic function circuit interconnect architecture of claim 37 wherein said logic function circuits comprise at least one RAM element.

* * * * *

UNITED STATES PATENT AND TRADEMARK OFFICE
CERTIFICATE OF CORRECTION

PATENT NO. : 5,367,208

DATED : Nov. 22, 1994

INVENTOR(S) : Abbas El Gamal, Steve S. S. Chiang

It is certified that error appears in the above-identified patent and that said Letters Patent is hereby corrected as shown below:

On the title page: Item [54] and Column 1, line 1,

The title should read --Programmable Interconnect Architecture--

Item [75]

"Steve S. S. Chiang" should be deleted as an inventor. The list of inventors should read as --Abbas El Gamal, Palo Alto; Khaled A. El-Ayat, Cupertino; Amr Mohsen, Los Gatos, all of Calif.--

Signed and Sealed this

Eighth Day of August, 1995

Attest:

BRUCE LEHMAN

*Attesting Officer*          *Commissioner of Patents and Trademarks*